United States Patent [19]

Jerome et al.

[11] Patent Number: 5,149,946
[45] Date of Patent: Sep. 22, 1992

[54] METHOD OF AUTHENTICATING AN OBJECT BY ELECTRON PARAMAGNETIC RESONANCE, APPARATUS FOR IMPLEMENTING THE METHOD, AND AN OBJECT USEABLE WITH THE METHOD

[75] Inventors: Denis Jerome, Jouy en Josas; Georges Tevanian, l'Hay les Roses; Patrick Batail; Marc Fourmigue, both of Paris, all of France

[73] Assignee: Centre National de la Recherche Scientifique (CNRS), Paris, France

[21] Appl. No.: 595,388

[22] Filed: Oct. 10, 1990

[30] Foreign Application Priority Data

Oct. 13, 1989 [FR] France .................... 89 13418

[51] Int. Cl.$^5$ .................... G06K 7/08; G01V 3/00; C07C 13/48
[52] U.S. Cl. .................... 235/439; 235/449; 324/300; 324/316; 324/318; 585/26
[58] Field of Search .............. 235/449, 439; 324/300, 324/316, 318; 128/654, 653 CA; 378/44, 45, 53; 568/16; 585/26

[56] References Cited

U.S. PATENT DOCUMENTS

| | | | |
|---|---|---|---|
| 3,529,235 | 9/1970 | Day .................... | 324/316 |
| 3,673,107 | 6/1972 | Peters .................... | 324/316 |
| 4,146,792 | 3/1979 | Stenzel et al. .................... | 250/372 |
| 4,376,264 | 3/1983 | Dokter et al. .................... | 324/316 |
| 4,674,513 | 6/1987 | Jasper, Jr. .................... | 324/316 |
| 4,714,886 | 12/1987 | Halpern .................... | 324/316 |
| 4,782,296 | 11/1988 | Schmalbein et al. .................... | 324/316 |
| 4,956,508 | 9/1990 | Michel et al. .................... | 585/26 |
| 4,984,573 | 1/1991 | Leunbach .................... | 128/653 CA |

FOREIGN PATENT DOCUMENTS

| | | |
|---|---|---|
| 0033994 | 8/1981 | European Pat. Off. . |
| 3408086 | 9/1985 | Fed. Rep. of Germany . |
| 2627179 | 8/1989 | France . |
| 6613250 | 3/1967 | Netherlands . |

OTHER PUBLICATIONS

Measurement and Control, vol. 21, No. 3, Apr. 1988, London GB, pp. 83-86; R. Ladbury: "Electron Spin Resonance".
The Review of Scientific Instruments, vol. 41, No. 3, Mar. 1970, pp. 319-321; R. G. Parker and J. Jonas; "Adiabatic Fast Passage Method for Spin-Relaxation Time Measurements".

Primary Examiner—Stuart S. Levy
Assistant Examiner—Edward Sikorski
Attorney, Agent, or Firm—Blakely, Sokoloff, Taylor & Zafman

[57] ABSTRACT

The invention relates to a method of authenticating an object by electron paramagnetic resonance spectroscopy, the method being characterized in that at least one authenticating substance is added to the object, said substance having an EPR peak whose width is not greater than about 1.5 gauss, with the spectroscopy being performed in a static field of an amplitude such that the substance has a resonance frequency in the radio-frequency domain, and with the width of the EPR peak of the substance being used as a criterion for discrimination. The static field preferably has a low frequency colinear modulation field superposed thereon having an amplitude which is substantially greater than the EPR width of the substance, and under a radiofrequency electromagnetic field extending perpendicularly to the static field and to the modulation field and having an amplitude which is not less than the peak width, whereby paramagnetic materials having a peak width which is greater than that of the authenticating substance are not detected. The invention also provides apparatus for implementing the method, and security paper useable with the method.

12 Claims, 3 Drawing Sheets

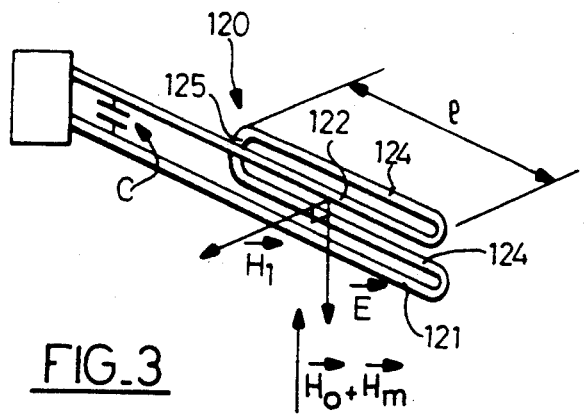
FIG_3
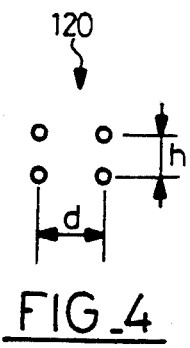
FIG_4
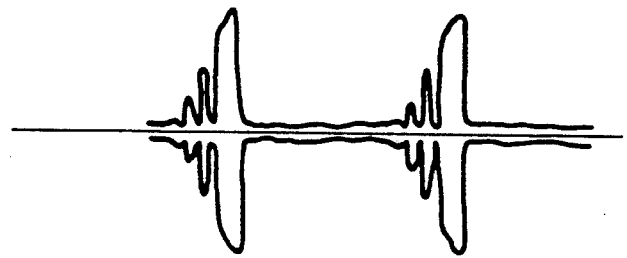
FIG_5
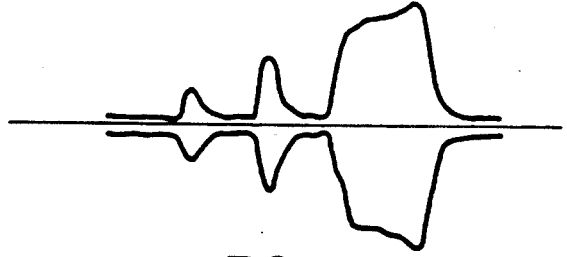
FIG_6
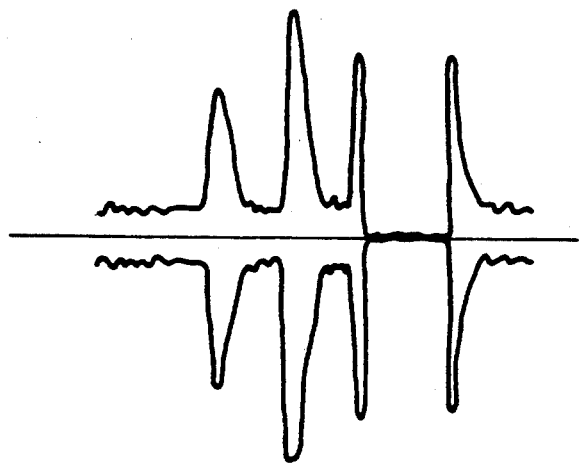
FIG_7

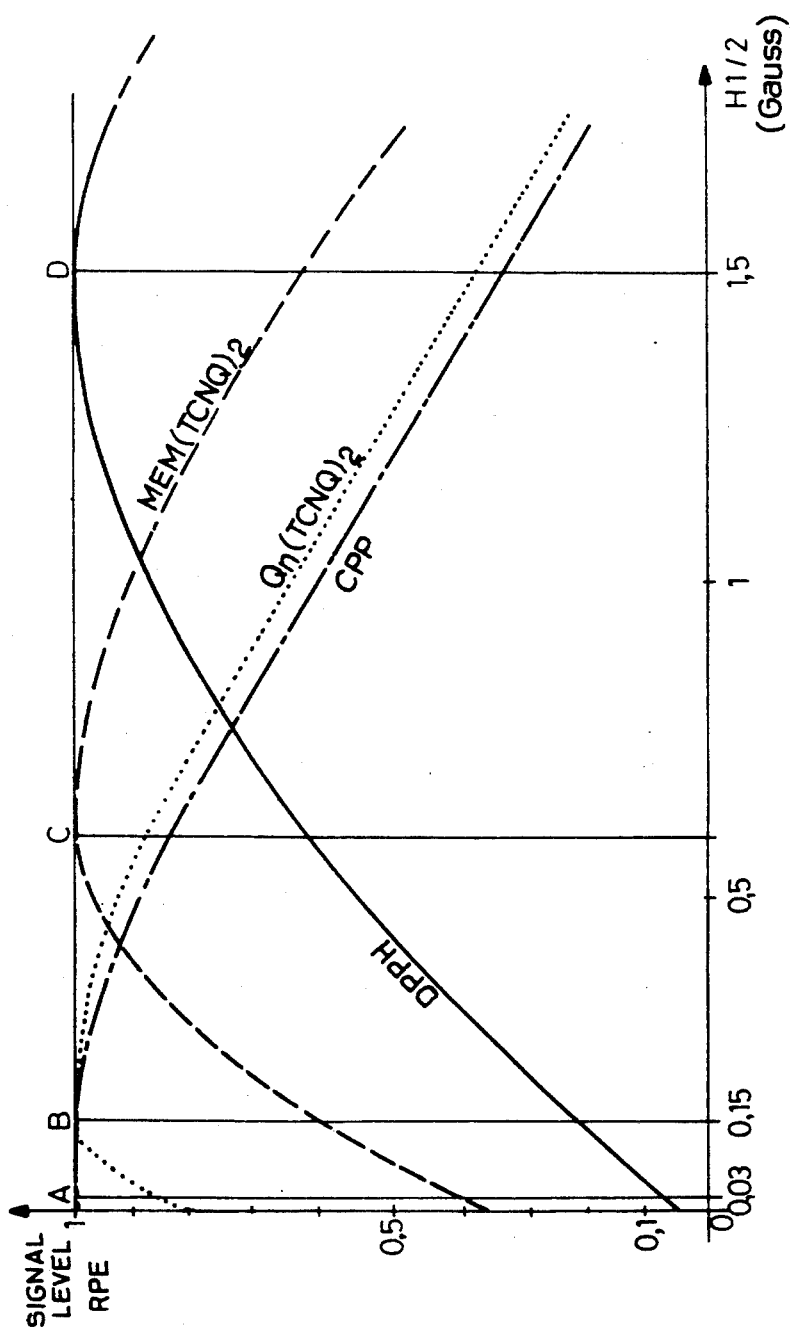
FIG_8
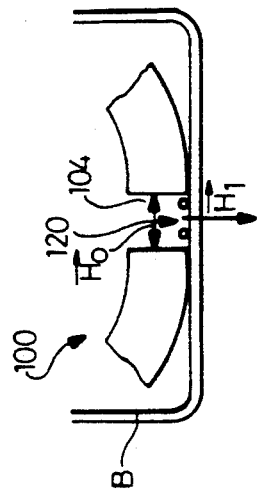
FIG_9

METHOD OF AUTHENTICATING AN OBJECT BY ELECTRON PARAMAGNETIC RESONANCE, APPARATUS FOR IMPLEMENTING THE METHOD, AND AN OBJECT USEABLE WITH THE METHOD

The invention relates in general terms to the field of authentication and identification, and more particularly it relates to a new method of verifying the authenticity of objects and/or identifying them, a new apparatus for implementing the method, and new substances adapted to the method and the apparatus. The term "substance" is used to cover any substance capable of being applied locally to an arbitrary object or substrate, e.g. like an ink.

Numerous techniques are already known for authenticating papers of value, or the like, and in particular there is the technique which consists in incorporating a substance in banknote paper or ink used in the manufacture of banknotes or the like, said substance having a particular spectral response when subjected to examination by electron paramagnetic resonance (EPR), also known as electron spin resonance (ESR). The state of the art is exemplified by the following patents: EP-A-0 033 994 and DK-A-147 737.

The first-mentioned patent teaches the use of substances having EPR characteristics such as the salts of transition metals or of lathanides having an incomplete 3d layer or 4f layer. The characterization of the presence of such substances in paper or the like is performed by a high field EPR method (several tens of kilogauss) using frequencies situated in the microwave range (band X or K). These substances have an EPR spectrum including several peaks with respective widths of about 10 gauss and spaced apart by determined values that are characteristic of the substance used.

The second above-mentioned patent teaches the use of the salts of organic radical ions belonging to the family of organic conductors as substances having EPR characteristics. These substances are constituted by separate stacks of $\pi$ electron donor molecules (easily oxidized to cation radicals) and $\pi$ electron acceptor molecules (easily reduced to anion radicals). By way of example, mention may be made of the pair TTF (donor)/TCNQ (acceptor). The EPR signal from each of the substances described in this patent as detected in the microwave frequency band is constituted by a single peak characterized by its position, i.e. by the value of the magnetic field $H_0$ at which it appears, with the position of said peak being determined by the Lande factor g of the spin system of the substance in question. When used as a discrimination means, this factor g which varies very little (typically having a relative difference of about $10^{-4}$) from the value $g_e$ for a free electron, requires the use of frequencies which are as high as possible, of the order of 10 GHz to 30 GHz.

Thus, all prior techniques require the use of microwave frequencies, i.e. having values for the field $H_0$ which are extremely high, being about 3 kG to 10 kG or more. They also require the field $H_0$ to be extremely uniform and extremely stable with values of the order of $\Delta H_{\frac{1}{2}}/H_0$.

However, the use of a magnetic field which is high, very uniform, and very stable is disadvantageous since it requires bulky and expensive means for generating it. In addition, the discrimination obtained using known techniques, even under such high fields, is sometimes inadequate in that several different paramagnetic substances may give very similar results with respect to resonance spectrum.

Also, in banks or similar establishments, a high value for the magnetic field $H_0$ runs the risk of wiping out data contained on magnetic media (such as magnetic tape or bank cards) brought into the vicinity of the detection apparatus.

The present invention seeks to mitigate these drawbacks of the prior art and to provide a method and an apparatus for authentication and/or identification purposes using electron paramagnetic resonance, capable of discriminating effectively between an authentic object and a non-authentic object while using electron paramagnetic resonance as the discrimination means, and requiring a field of moderate static amplitude only, without difficult requirements as to stability and uniformness of the field.

To this end, the present invention firstly provides a method of authenticating and/or identifying an object, the method being of the type in which electron paramagnetic resonance spectroscopy is used, and being characterized in that a determined quantity of at least one authenticating substance is added to the object, said substance presenting an electronic paramagnetic resonance peak of width no greater than about 1.5 gauss, in that electron paramagnetic resonance spectroscopy is performed using a static magnetic field having an amplitude such that the substance presents a resonance frequency in the radiofrequency domain, and in that the width of the peak is used as a discriminating criterion.

The term "radiofrequency" is used herein to mean frequencies lying in the top of the VHF band or in the bottom of the UHF band, and typically frequencies not greater than about 1 GHz. As explaned below, this corresponds to a static field having a value of not more than about 370 gauss.

Preferably, a colinear modulation magnetic field is superposed at low frequency and at an amplitude that is substantially greater than the width of the peak in the authenticating substance and under a radiofrequency electromagnetic field perpendicular to the static field and to the modulation field, and whose amplitude is not less than the width of the peak, in such a manner as to avoid detecting paramagnetic materials having a peak of width greater than that of said substance.

The invention also provides apparatus for implementing the above-defined method, the apparatus being characterized in that it comprises:

means for establishing a static magnetic field which is essentially uniform and constant;

means for superposing a colinear modulation magnetic field on the static magnetic field, the modulation field being of determined amplitude and frequency;

means for establishing a radiofrequency magnetic field of determined amplitude and frequency and extending perpendicularly to the static and the modulation magnetic fields, and means for detecting variations in said radiofrequency magnetic field; and means for demodulating the detected variations in the radiofrequency field and for generating information representative of the amplitude of the demodulated signal.

Finally, the invention also provides an object having an authenticating characteristic, the object being characterized in that it includes an authenticating substance having a narrow electron paramagnetic resonance peak, the substance being constituted by a salt of tetrahydro-1,2,7,8 dicyclopentaperylene.

Other aspects, objects, and advantages of the present invention appear more clearly on reading the following detailed description of a preferred embodiment thereof, given by way of non-limiting example and with reference to the accompanying drawing, in which:

FIG. 3 is a perspective view of a detail of the FIG. 2 apparatus;

FIG. 4 is a cross-section through a detail of FIG. 3;

FIGS. 5 to 7 are oscillograms of EPR signals for different substances;

FIG. 8 is a graph showing curves of EPR signal level as a function of looked-for spectrum line width for various substances; and FIG. 9 is a diagram through variant apparatus.

Figure 1:
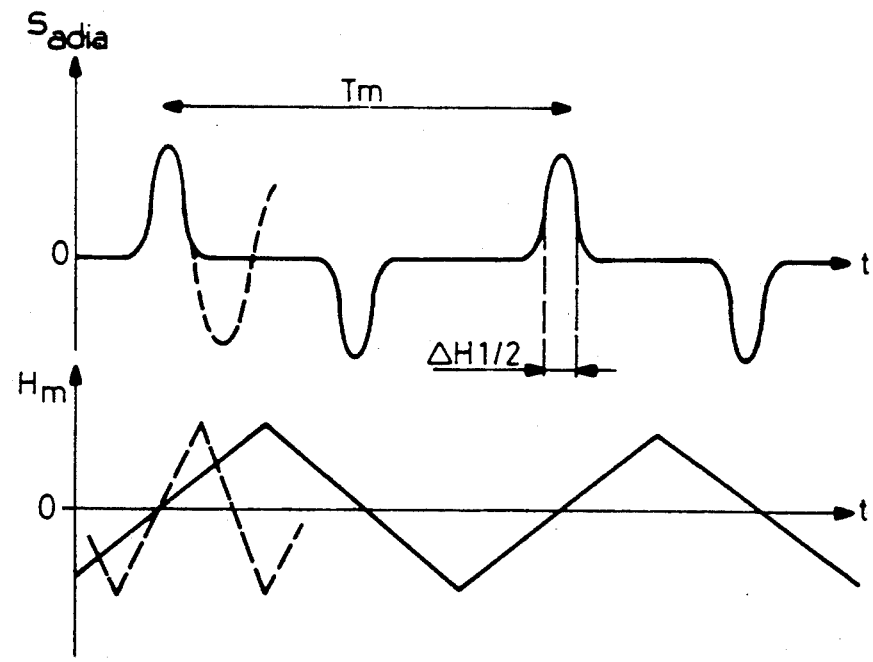
FIG. 1 is a waveform diagram showing one particular implementation of the invention.

Firstly it is recalled that the resonant frequency $F_1$ of the spin of an electron placed in a magnetic field $H_0$ is related to the field by the equation:

$$F_1 = g\beta H_0/h$$

where:

$\beta$ is the Bohr magneton;

h is Planck's constant; and g is the Lande factor, characteristic of the system of spins of the substance whose resonance is being observed.

In practice, this equation gives rise to a resonance frequency of about 2.7 MHz per gauss of the field $H_0$.

In accordance with the present invention, an EPR method is used at low field, with substances having narrow peaks, with discrimination being performed either by eliminating wider peaks belonging to other EPR substances that may be present, or else by direct determination of peak width.

More precisely, using values for the field $H_0$ such that the EPR substance resonates in the radiofrequency domain, and more particularly using values lying in the range from about 50 gauss to about 370 gauss, together with substances having a narrow peak, typically having a width lying between a few tens of milligauss and about 1.5 gauss, the essential advantages are as follows:

the increase in peak width due to the aniostropy of the g factor (the Lande factor of the substance under consideration), in particular for substances in powder form, does not significantly degrade the form of the EPR signal;

in order to be able to use the EPR peak width as a means for discriminating between compounds having high susceptibilities of similar values but different peak widths, it is only necessary for the uniformness and the stability of the field $H_0$ to be maintained within maximum errors of about 100 mG, i.e. a relative stability of about $10^{-3}$ or even less, and this can be obtained without particular technical difficulties;

the relatively low value of the magnetic field $H_0$ can be obtained by means which are simple, cheap, and compact, and without risk for data stored on magnetic media; and by operating in the radiofrequency domain, it is possible to use a detector probe which is small in size, and which has excellent detection stability (by virtue of a high filling factor).

In this context, a preferred solution for obtaining and observing the EPR signal consists in a transient detection method, and more particularly in a "fast adiabatic pass" method.

As explained below, this solution provides good sensitivity and makes it possible to authenticate or identify objects by using very small quantities of EPR substance. In addition, it is particularly advantageous in its capacity to detect EPR peaks in very short periods of time, thereby enabling effective authentication or identification to be performed even when the EPR mark added to an object is moving very quickly relative to the EPR probe. In addition, by an appropriate selection of values for various parameters, as explained below, it makes it possible to discriminate between substances having different peak widths (and similar high susceptibilities). Finally, this method also has the advantage of not requiring particularly high stability or uniformity of the static field $H_0$.

The fast adiabatic pass method reverses magnetization by varying the value of the static field $H_0$ appropriately, and more precisely by starting with a value for the field $H_0$ situated well below the value at which resonance occurs and by increasing $H_0$ regularly at an angular frequency which is sufficiently slow compared with $\gamma B_1$ (where $\gamma$ is the gyromagnetic ratio of the substance under consideration, and $B_1$ is the magnetic induction corresponding to the radiofrequency field $H_1$ perpendicular to $H_0$), while nevertheless being sufficiently fast to reach resonance in a very short period of time so that the spins do not have time to relax.

In practice, this change in $H_0$ can be obtained by superposing on the static field $H_0$ a colinear modulation field $H_m$ of given amplitude $H_m$ and angular frequency $\Omega_m$, having a triangular waveform or preferably a sine waveform. In order to satisfy the fast adiabatic pass condition, and as mentioned above, it is necessary for:

$$\Omega_m << \gamma B_1$$

On passing through resonance, the amplitude of the EPR signal observed on the dispersion component (given that saturation occurs when $H_1 > \Delta H_{\frac{1}{2}}$ in the absorption component), is proportional to:

$$S_{adia} = \pm M_0 \cdot H_1 / \sqrt{(H_m^2 + H_1^2)}$$

where $M_0 = \chi_0 \cdot H_0$, and assuming that the amplitude of $H_m$ is sufficiently large compared with the amplitude of $H_1$, the maximum observable amplitude at resonance is proportional to:

$$S_{adia} \approx M_0 \approx \chi_0 \cdot H_0$$

where $\chi_0$ is the magnetic susceptibility of the EPR substance under consideration.

In addition, it can be shown that when $H_1$ is not less than the width of peak $\Delta H_{\frac{1}{2}}$, all of the spins take part in the resonance and the amplitude of the observed signal is maximal. However, if $H_1$ is less than the peak width, then the observed EPR signal is proportional to the ratio $H_1/\Delta H_{\frac{1}{2}}$.

In accordance with an essential aspect of the present invention, it will therefore be understood that it is possible to discriminate between substances having similar magnetic susceptibilities but different peak widths. More precisely, by adjusting the amplitude of the field $H_1$ so that it is equal to or slightly greater than the width of the peak of the authenticating EPR substance, the resulting EPR signal is maximal when said substance is present (the object is authentic) and is at a lower amplitude when the substance is absent (non-authentic object).

It will therefore be understood that it is particularly advantageous to use a substance whose peak width is as narrow as possible.

In addition, another appreciable advantage of the fast adiabatic pass method is obtained when the amplitude of the modulation field $H_m$ is selected to be large, and in particular at least ten times the width of the looked-for peak $\Delta H\frac{1}{2}$. This serves to absorb possible drift in the static field $H_0$. Thus, at a static field of 100 gauss, for example, a drift in this field of 100 mgauss does not have a significant effect on the signal $S_{adia}$. In practice, relative variations in the static field $H_0$ of about $10^{-3}$ can be accommodated without having an effect on the resulting EPR signals.

FIG. 1 shows the EPR signal $S_{adia}$ characteristic of the fast adiabatic pass as a function of time, with the lower curve showing the variation in the modulation magnetic field $H_m$ that created the phenomenon. The signal $S_{adia}$ shown is in fact the envelope of the signal obtained in the EPR probe at the frequency of $H_1$, and is obtained by appropriate amplitude demodulation.

The width $\Delta H\frac{1}{2}$ at half the maximum magnitude of the signal Sadia (corresponding in this case to a length of time) does not depend on the times $T_1$ and $T_2$ (which are the spin-lattice and spin-spin relaxation times respectively of the EPR substance), but only on the amplitude of the radiofrequency field $H_1$ and on the time it takes to pass through resonance, as determined by the angular frequency $\Omega_m$. The signals are positive when passing through resonance in a rising direction and negative when passing through resonance in a falling direction.

In FIG. 1, the period $T_m = 2\pi/\Omega_m$ of the modulation field $H_m$ is considerably greater than the duration of the resonance peaks in the signal $S_{adia}$. It will be understood that if $T_m$ is made to vary in such a manner that the end of a positive peak runs on immediately into the beginning of a negative peak or vice versa, then the observed EPR signal will be substantially sinusoidal having the same period as $H_m$.

Preparing the signal $S_{adia}$ in this particular way is most advantageous since its frequency spectrum is then reduced to a single component at the frequency $\Omega_m/2\pi = 1/T_m$.

In this case, it is particularly advantageous for the means which process the signal $S_{adia}$ by amplifying it after demodulation to include appropriate filtering, which is technically simple to provide. More precisely, a passband filter centered on the frequency $1/T_m$ will considerably improve the signal-to-noise ratio in the signal $S_{adia}$ without attenuating the amplitude of this signal.

In addition, when the EPR substance to be observed passes through the EPR probe at high speed, it is merely necessary for the modulation period $T_m$ of the field $H_0$ to be much less than the time the said substance is transitting through the probe, to ensure that a sufficient number of magnetic reversal cycles are observed during said transit time for appropriately detecting the substance. For example, assume that $T_m = 28$ μs that the EPR substance is in the form of a mark having a diameter of 3 mm on the object, and that the object and the probe are travelling at a relative speed of 8 meters per second (m/s). The transit time is then 375 μs, which means that more than 13 magnetization reversal cycles can be observed during the pass. The fast adiabatic pass technique is thus particularly well adapted to detecting EPR marks travelling at high speed through the probe.

In this respect, it is pointed out that this adiabatic detection method retains its advantages when using a high field detection technique. More precisely, the fast adiabatic pass method is also capable of detecting small-sized marks in very short periods of time in a high field, thus making it possible to move objects carrying marks at high speed through the probe under high field conditions as well.

Another method of detection in accordance with the invention is also described, and this method is referred to as the "steady state" method. In this method, in addition to modulating the field $H_0$ with a colinear field $H_m$, the field $H_0$ is scanned very slowly by also superposing thereon an alternating field $H_b$ of given period $T_b$, so as to cause $H_0 + H_b$ to pass through a value that gives rise to resonance. The maximum value of the EPR signal, written S, is proportional to $\chi_0 \cdot H_0$.

By using synchronous detection, it is possible to observe the derivative signal S' whose amplitude is equal to $S/\Delta H\frac{1}{2}$, said derivative signal thus increasing in amplitude with narrowing peak width. The additional advantage obtained in this case is that the signal provides information directly about the value of the width of the peak, even if it has been widened. More precisely, by selecting the modulation frequency $F_m = 1/T_m$ to be less than $1/T_2$ where $T_2$ is the spin-spin relaxation time of the spin system under consideration, by adjusting the amplitude of $H_m$ to be equal to exactly twice the peak width $\Delta H\frac{1}{2}$ of the compound to be observed, and by adjusting the amplitude $H_b$ to have a value of about ten times the width $\Delta H\frac{1}{2}$, it is possible to show that after appropriate demodulation the EPR absorption signal is observed directly.

The steady state method, although slower than the adiabatic method by virtue of the very slow modulation by $H_b$, may advantageously be used when the objects to be identified are stationary or are moving very slowly relative to the EPR probe, and when it is also desired to measure the peak width of the substance directly.

A possible embodiment of electron paramagnetic resonance detection apparatus suitable for implementing the adiabatic technique described above is itself described below with reference to FIGS. 2 to 4.

The apparatus includes means for:

generating a static field $H_0$ with relative uniformness and stability of about $10^{-3}$ or better;

generating a modulation field $H_m$ of given waveform, frequency and amplitude, and colinear with the static field $H_0$;

generating a radiofrequency $H_1$ of given frequency and amplitude perpendicular to the fields $H_0$ and $H_m$; and detecting an EPR signal.

In addition, in the present example, any thin object to be authenticated or identified is allowed to pass through the EPR probe at a given speed lying in a direction included in its plane.

Figure 2:
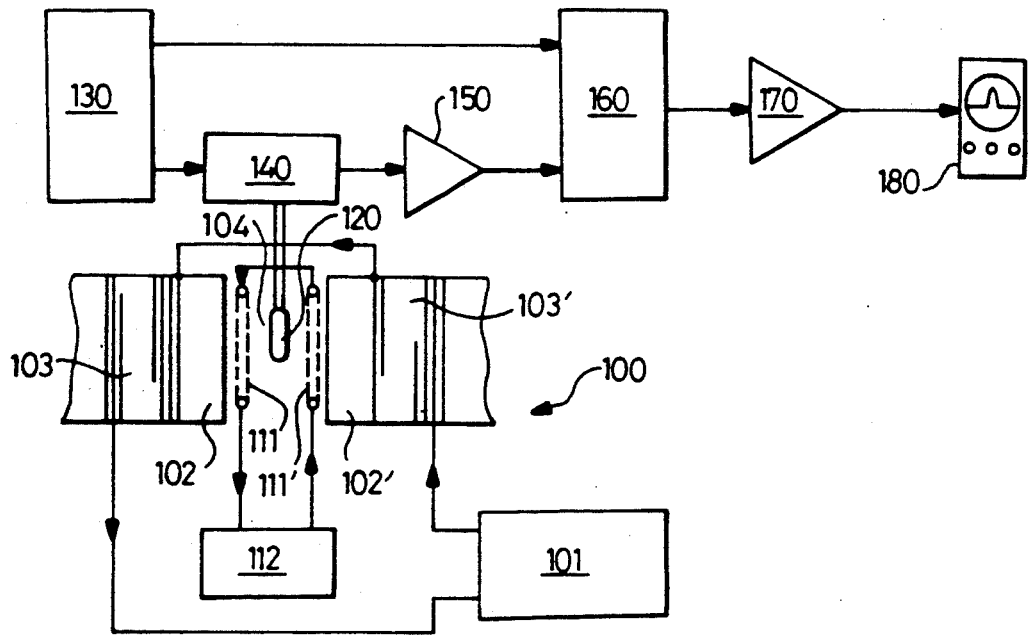
FIG. 2 is a block diagram of electron paramagnetic resonance apparatus of the invention.

With reference to FIG. 2, one possible solution for the field $H_0$ consists in using the field existing in the air gap of a magnetic circuit given an overall reference 100, with the magnetic circuit being DC biased by an adjustable DC source 101. In this case, the magnetic circuit comprises two ferrite cores 102 and 102' defining an air gap 104 between them and having coils 103 and 103' wound on them. Using such means, there is no difficulty in obtaining a field of about 50 gauss having uniformness of about $10^{-3}$ in a volume through which the EPR mark passes, i.e. in a volume centered on several square millimeters in the middle of the air gap 104. In a variant, it would also be possible to use a permanent magnet.

For example, the air gap may be 10 mm wide, having pole faces on the cores with a diameter of 30 mm and being mutually parallel to within 10 μm and having very good surface state.

The modulation field $H_m$ is produced, for example, by a pair of Helmholtz coils 111 and 111' placed inside the air gap 104 of the magnetic circuit 100. It is recalled that a pair of Helmholtz coils is constituted by two coils on the same axis, each having the same radius R, with the coils being spaced apart at a distance R. The coils 111 and 111' are fed from a low frequency generator 112 capable of delivering a sinewave or triangular signal of adjustable amplitude and fixed frequency (when only one EPR substance is to be detected) or adjustable in frequency (when several EPR substances having different characteristics are to be detected individually). The generator 112 may deliver a frequency of about 35 kHz, for example.

The radiofrequency field $H_1$ must be perpendicular to the above two fields. This makes it impossible to use a conventional coil since a conventional coil would be disposed transversely to the direction of travel of a document to be authenticated or identified, and would prevent it from passing through the air gap.

Thus, in accordance with another essential aspect of the present invention, and still with reference to accompanying FIGS. 2 to 4, the field $H_1$ is established by means of a short-circuited tuned bifilar line, given overall reference 120.

It is well known in theory that when a tuned bifilar line of length $1 = \lambda/4$ is short circuited (where $\lambda$ is the wavelength of the radiation to be emitted), it acts as a resonator at said wavelength having standing voltage and current waves thereon which give rise firstly to an electrostatic field E lying in a direction contained in the plane of the two conductors and perpendicular to the conductors, and secondly a magnetic field $H_1$ perpendicular to E, as shown. The current, and thus the field $H_1$ are thus maximal in the vicinity of a short circuit.

In addition, the length of the resonator can easily be shortened while still allowing it to resonate at wavelength $\lambda$, merely by using an external capacitor to compensate for the capacitive deficit thus generated. The external capacitor is referenced C in FIG. 3.

The solution described has several advantages:

the resonator (equivalent to a "resonant cavity" for microwave frequencies) occupies a very small volume;

the current and thus the field $H_1$ are maximal and practically constant at any point which is at a distance of less than one tenth of the length 1 of the resonator from the short circuit;

the electrostatic field is practically zero in this region, thereby minimizing dielectric losses due to objects to be authenticated going past; and a passage is left free for thin objects.

These advantages are obtained by folding the short-circuited end of the line through 180°, as shown in FIG. 3, so as to obtain a configuration reminiscent of a paper-clip. Thus, the line 120 comprises a first portion constituted by wire sections 121 and 122, a 180° bend (rearwards in FIG. 3), a second portion constituted by wire sections 123 and 124, extending parallel to the first sections, and terminated by the short circuit 125.

Preferred, but non-limiting values for the distances l, h, and d shown in FIGS. 3 and 4 are l=10 mm, h=1 mm, and d=4 mm.

In a variant embodiment (not shown) the various conducting sections of the resonator 120 may be made in the form of conducting tracks disposed in appropriate manner on a flexible substrate, with the substrate then being appropriately folded through 180° in order to define the resonator. The object to be identified is conveyed by conventional transport means between the two branches of the substrate.

In yet another variant, printed circuit boards can be used which are placed parallel to each other at a short distance apart.

As shown diagrammatically in FIG. 2, the resonator or probe 120 is placed in the air gap 104 such that each conducting section 121 to 124 lies parallel to the faces of the cores 102 and 102', thereby setting up a field $H_1$ perpendicular to the plane of the sheet of the drawing, i.e. perpendicular to $H_0$ and $H_m$.

The EPR signal is detected by the above-described resonator, and more particularly by picking up the voltage V present across the terminals of the resonator, which voltage is converted into the signal $S_{adia}$ after appropriate treatment.

This signal is at a maximum, referred to as $V_{max}$, when the amplitude of $H_1$ is selected to be equal to the peak width of the selected EPR substance, as mentioned above. Thus:

$$V_{max} = \chi_0 \cdot H_0 \cdot \omega_1 \cdot \eta \cdot Q \cdot A$$

where $\eta$ is the filling coefficient, i.e. the ratio between the volume of the sample or of the mark of EPR substance and the volume of the resonator 120; Q is the quality factor of the resonator; and A is the area through which the magnetic flux passes, i.e. the right cross-section of the resonator.

Returning to FIG. 2, the apparatus also includes a radiofrequency source 130 which delivers an output sinewave signal as a frequency $f_1 = \omega_1/2\pi$ which may be adjusted in amplitude and frequency in order to determine the amplitude and frequency of the radiofrequency $H_1$.

The resonator 120 is connected to the source 130 via a 180° hybrid bridge referenced 140, which directly delivers a signal at the frequency f exhibiting the variation in the voltage V produced by passing through resonance.

This signal from the hybrid bridge is amplified in a wideband HF amplifier 150 having a gain of about 30 dB, for example, and is then applied to the input of a phase detector 160 where it is demodulated. The local input to the phase detector 160 is therefore connected to the output of the radiofrequency source 130 for this purpose.

The demodulated signal 160 is then applied to the input of a high gain selective amplifier 170, e.g. having a gain of about 90 dB to 100 dB. The filtering performed by this amplifier is bandpass filtering tuned to the frequency of the modulation magnetic field $H_m$, and its Q factor is deliberately restricted to a medium value, about 30 or 40, so that the resulting time constant is compatible with the short time a 3 mm diameter mark of EPR substance takes to pass through the resonator at a speed of 8 m/s.

In the experimental apparatus described above, signals are observed by means of an oscilloscope 180. However, in practice, the oscilloscope would be replaced by an electronic circuit, e.g. a threshold detection circuit which would determine whether the pulses provided by the amplifier 170 are greater than or less than a pre-established value, thereby indicating whether a marked object passing through the probe possesses an authenticating EPR mark or not.

TESTS

Tests have been performed on samples of paper coated in an ink made up from crystals of salts of dicyclopentaperylene (CPP), after being reduced to a powder having a grain size of 40 μm and being coated in a vehicle at a concentration of 20% by weight.

Two samples and a control strip of blank paper were applied to the periphery of a supporting disk of insulating material having a diameter of 38 cm and a thickness of 0.5 mm, with the disk being rotated at a speed of 100 revolutions per second so as to move the samples and the control strip at a speed of 7,6 m/s. This was to simulate the conditions of a paper medium or the like bearing an EPR mark passing quickly through an authentication machine. The first sample was in the form of a 3.5 mm diameter disk and the second sample was in the form of a 2 mm by 4 mm rectangle, with the samples respectively comprising 70 μg and 150 μg of active material.

The support disk was placed in the air gap of the above-described EPR probe.

The experimental conditions were as follows:

| | |
|---|---|
| static field | $H_0$ = 74.6 gauss |
| radiofrequency | f = 209 MHz |
| modulation frequency | $1/T_m$ = 35 kHz |
| amplitude of modulation field | $H_m$ = 400 m gauss |
| excitation/detection field | $H_1 \approx$ 50 m gauss |
| CPP peakwidth | $\Delta H_{\frac{1}{2}}$ = 26 m gauss |

The oscillogram of FIG. 5 shows two consecutive series of EPR signals spaced apart in time due to one complete revolution of the disk. FIGS. 6 and 7 are expanded oscillograms of the same signals.

Three peaks can be seen corresponding respectively to the control strip, to the 70 μg sample and to the 150 μg sample.

For the 70 μg sample, a signal-to-noise ratio of about 7 can be observed, which situates noise as being equivalent to about 10 μg of the substance.

FIG. 8 is a diagram showing the behavior of various substances having narrow EPR peaks, together with the possibilities of distinguishing between these substances.

As mentioned above, in the fast adiabatic pass method, observation conditions for a maximum amplitude EPR signal relating to a given substance depend essentially:

on the amplitude of the radiofrequency $H_1$, which must be greater than $\Delta H_{\frac{1}{2}}$;
on the amplitude of the modulation field $H_m$, which must be greater than 10 $\Delta H_{\frac{1}{2}}$; and
on the time taken to pass through resonance, determined by the angular frequency $\Omega$, which must be greater than the relaxation times $T_1$ and $T_2$.

Substances having peaks of different widths therefore correspond to different pairs of optimum values for $H_1$ and $H_m$ for observing a maximum EPR signal.

Studying how the response of a substance of given peak width varies over a set of $H_1$ and $H_m$ pairs adapted to various substances having different peak widths demonstrates the discriminatory capacity of the sensor.

Thus, the width of the peak $\Delta H_{\frac{1}{2}}$ is plotted along the X axis of FIG. 8, with said width being determined, in fact, by a set of pairs of optimum values $H_1$ and $H_m$, while the amplitude of the signal $S_{adia}$ is plotted up the Y axis.

In addition, the curves corresponding to responses for different substances have been normalized (so that the maximum in each case is equal to one), and in practice this corresponds to using a quantity of each substance which is inversely proportional to its magnetic susceptibility.

The optimum conditions for each of the substances shown in FIG. 8 by references A, B, C, and D, are as follows:

| | Substance | $H_m$(mV) | $H_1$(dB) | $\Delta H_{\frac{1}{2}}$(mgauss) |
|---|---|---|---|---|
| A | $(CPP)_2PF_6^{(1)}$ | 20 | 4 | 30 |
| B | $Q_n(TCNQ)_2^{(2)}$ | 30 | 5 | 150 |
| C | $MEM(TCNQ)_2^{(3)}$ | 70 | 10 | 600 |
| D | $DPPH^{(4)}$ | 300 | 16 | 1500 |

(1) salt of tetrahydro-1,2,7,8 discyclopentaperylene;
(2) quinolinium (tetracyanoquinodimethane)₂;
(3) methyl-ethyl-morpholinium (tetracyanoquinodimethane)₂;
(4) α,α-diphenyl-β-picryl-hydrazyl The value of the field $H_m$ is determined by the amplitude indicated in mV for the voltage applied to the Helmholtz coil; the field $H_1$ is evaluated in dBm with 0 dBm = 1 mW in 50 Ω.

As can be seen in FIG. 8, for optimum conditions corresponding to $(CPP)_2PF_6$ (case A), the responses of other substances are:
$Q_n(TCNW)_2$: 0.85
$MEM(TCNQ)_2$: 0.4
DPPH: 0.1

Similarly, under optimum conditions corresponding to DPPH (case D) the responses to other substances are:
$(CPP)_2PF_6$: 0.35
$Q_n(TCNQ)_2$: 0.4
$MEM(TCNQ)_2$: 0.65

Thus, by virtue of different peak widths, it is possible to perform reliable discrimination between $(CPP)_2PF_6$ and DPPH, for example.

In addition, it is also possible and advantageous to use a mixture of two substances having different peak widths, making it possible to discriminate them relative to other substances having greater or intermediate peak widths. In a first case, each of the two substances has a peak width less than or equal to about 1.5 gauss; in a second case one of the substances has a peak width less than about 1.5 gauss while the other substance has a peak width is greater than said value.

The description above relates to an EPR detection probe through which thin objects can be caused to travel for authentication or identification.

The description below made with reference to FIG. 9 relates to another embodiment of an EPR probe for use with a low field and making it possible to detect EPR marks on objects which are arbitrary in nature, shape, and size.

In FIG. 9, items which are identical or similar to items in FIGS. 2 to 4 are designated by the same reference numerals.

The field $H_O+H_m$ is set up in the air gap of a magnetic circuit 100 of any appropriate type, while the electromagnetic field $H_1$ is set up by a short-circuited bifilar line 120 which resonate at the frequency of $H_1$ and which is contained in a plane parallel to the static field and situated in the vicinity of the bottom edge of the air gap. These means for establishing the fields and all of the associated electronic circuitry are contained, for example, in a portable housing B having a very thin wall (preferably only a fraction of a millimeter thick), which is inert relative to electromagnetic fields, e.g. a plastic material, and which is placed close to the bottom edge of the air gap and the bifilar line 120.

Another solution may consist in using technology inspired by magnetic heads.

The portable probe made in this way may be used for "reading" paramagnetic marks applied to the surfaces of objects of any type. Its sensitivity is less than the probe shown in FIGS. 2 to 4 since the EPR mark can only occupy a zone in which the static field $H_O$ is not rigorously uniform and in which the field $H_1$ is of reduced amplitude, even though sensitivity remains ample for performing read operations as required. In practice, it suffices to use marks including a quantity of substance which is greater than that required by the probe of FIGS. 2 to 4, and typically of the order of 100 μg to 500 μg.

Absolutely any type of EPR substance may be used in the context of the present invention so long as it has a relatively narrow peak width, which is typically less than or equal to 1.5 gauss, while also having high susceptibility $\chi_O$. Crystalline organic materials having metallic, semiconducting or insulating conductive characteristics may be mentioned.

In addition, objects that can be authenticated or identified with the method of the present invention may be of absolutely any type; banknote paper; other types of paper for securities; bank cards; art objects or precious objects; etc. The EPR mark(s) added to an object may be of various shapes. When the object is paper or card or the like, the EPR substance may be locally incorporated in the bulk of the object; alternatively it may be encrusted at a point on the surface of the object, e.g. by using mechanical means, thermal means, etc.

Further, the method of the present invention can also be used for identification purposes by providing a plurality of EPR marks disposed in a well-determined manner. For example, the EPR marks may be disposed in a manner analogous to bar codes. In this case, the code is read either when the object goes through a fixed probe, e.g. of the type described with reference to FIGS. 2 to 4, or else by using a portable probe of the type shown in FIG. 9, in which case the probe moves over the surface of the object which remains fixed. The amplitude of the output signal from the treatment means varies as a function of the distribution of the paramagnetic zones and the non-paramagnetic zones of the marking and can be used to perform appropriate decoding in order to reconstitute the encoded information.

A particularly advantageous way of providing such a bar code or the like may be based on the fact that some EPR substances permanently lose their paramagnetic properties on being heated to a given temperature, which temperature varies depending on the substance.

It is thus possible, in accordance with the invention, to make a single mark of EPR substance occupying a relatively large area, and then to selectively "burn" the substance in predetermined zones of the mark in order to kill the paramagnetic properties of the substance in these zones, while retaining said properties in other zones.

Such selective "neutralization" corresponds to a genuine method of writing in code and may be performed by means of a laser beam, or the like.

An advantage of paramagnetic bar codes over conventional optically-read bar codes lies in the fact that the code can now be hidden. Thus, visual masking using paint or the like and having the same appearance as the EPR substance can be used to prevent the EPR marking being visible to the eye. Also, paramagnetic masking can be provided by means of a layer of a different EPR substance having a similar Lande factor but a peak of substantially greater width, in which case identification can be obtained only by adjusting the EPR apparatus to the narrower peak width, thereby making it possible to read the code without the effectiveness or the speed of reading being compromised in any way.

Naturally, the present invention is not limited in any way to the embodiments described above and shown in the drawings, and the person skilled in the art will be capable of making modifications and variants in accordance with the spirit of the invention.

We claim:

1. An apparatus for authenticating and/or identifying a document using electron paramagnetic resonance spectroscopy, a quantity of at least one authenticating substance being added to the document in powder form and having a paramagnetic resonance peak of a width ($\Delta H1/2$) not greater than 1.5 Gauss, said apparatus comprising:

means for applying to the document in a region incorporating said substance a static magnetic field (Ho) having an amplitude in the range 50–370 Gauss, whereby said resonance peak of said at least one substance occurs at a frequency in the range of about 135 MHz to 1 GHz, said means having a pair of parallel opposed end faces defining an air gap therebetween;

means for superimposing on said static magnetic field a modulation field (Hm) collinear with said static magnetic field;

means for applying to said document in said region an electromagnetic field (H1) at the frequency of said resonance peak and perpendicular to said static and modulation fields, said electromagnetic field having an amplitude equal or greater than said width of said resonance peak, said means comprising a bifilar line located in said air gap, tuned on said frequency of the resonance peak and having two branches each parallel to said faces defining said air gap, short-circuited together at a free end thereof and bent at an intermediate portion thereof; and phase detection means for detecting power variations of said electromagnetic field and for deriving therefrom information about the presence or absence of said substance having said peak width;

whereby a document to be authenticated and/or identified can be moved between the portions of said branches on either side of said bent regions in a direction essentially parallel to said opposed end faces.

2. An apparatus for authenticating and/or identifying a document using electron paramagnetic resonance spectroscopy, a quantity of at least one authenticating substance being added to the document in powder form and having a paramagnetic resonance peak of a width ($\Delta H1/2$) not greater than 1.5 Gauss, said apparatus comprising:

means for applying to the document in a region incorporating said substance a static magnetic field (Ho) having an amplitude such that said resonance peak occurs at a given angular frequency, said means having a pair of parallel opposed end faces defining an air gap therebetween;

means for superimposing on said static magnetic field a modulation field (Hm) having an angular frequency and collinear with said static magnetic field;

means for applying to said document in said region an electromagnetic field (H1) at the frequency of said resonance peak and perpendicular to said static and modulation fields, said electromagnetic field having an amplitude equal or greater than said width of said resonance peak;

phase detection means for generating at an output a signal representing the power variation of said electromagnetic field and derivation means for deriving from said signal information about the presence or absence of said substance having said resonance peak, wherein said angular frequency of said modulation field is such that a negative peak of said signal, indicative of a negative power variation, immediately follows a positive peak of said signal, indicative of a positive power variation, whereby said signal is essentially sinusoidal; and a band-pass filter means at the output of said phase detection means having a center frequency substantially equal to the angular frequency of said modulation field.

3. A method of authenticating and/or identifying a document, said method using the electron paramagnetic resonance properties of an authenticating substance, said substance being added to said document and having an electron paramagnetic resonance peak with a predetermined low width, said method comprising the steps of:

applying to a region of said document incorporating said substance a magnetic field (Ho+Hm) varying at a fixed angular frequency from a minimum value to a maximum value and vice-versa, the difference between said minimum and maximum values being substantially greater than the peak width of said substance;

applying to said region of said document an electromagnetic field (H1) perpendicular to said magnetic field and at a frequency equal to the resonance frequency of said substance as determined by a value of said magnetic field intermediate between said minimum and maximum values and at an amplitude substantially equal or slightly greater than the value of said peak width, said angular frequency of variation of said magnetic field and the magnetic induction of said electromagnetic field (H1) being selected so that said angular frequency is lower than the product of the gyromagnetic ratio of said substance and said magnetic induction;

performing phase detection on said electromagnetic field and generating a signal proportional to the power variation of said electromagnetic field, said angular frequency of said magnetic field being further selected so that a negative peak of said signal, indicative of a negative power variation, immediately follows a positive peak of said signal, indicative of a positive power variation, whereby said signal is essentially sinusoidal; and band-pass filtering said signal on a central frequency substantially equal to the angular frequency of said magnetic field, whereby the electron paramagnetic resonance of said substance provides an essentially sinusoidal signal of maximum amplitude, while any other substance showing a wider electron paramagnetic resonance peak present in said region of said document provides a signal of lower amplitude.

4. A method according to claim 3, wherein said document further incorporates a predetermined quantity of a second substance having electron paramagnetic resonance properties and a second resonance peak with a second, larger peak width.

5. A method according to claim 3, wherein said method is performed using a probe capable of generating said magnetic and electromagnetic fields while the probe and the document are in relative displacement.

6. A method according to claim 3 wherein said method is performed using a probe while the probe and the document are in relative displacement, and wherein the dimensions of said region containing said substance and the linear speed of said displacement are such that the transit time of said region through the probe is substantially greater than the period (Tm) of variation of said magnetic field (Ho+Hm).

7. A method according to claim 3, wherein the difference between the minimum and maximum values of said magnetic field is set to at least ten times the peak width of the authenticating substance.

8. A method according to claim 3, wherein said authenticating substance is added to said document in the form of a plurality of marks defining a document-identifying code.

9. A method according to claim 8, wherein said plurality of marks are formed by initially forming a single and substantially uniform zone of an authenticating substance and then by thermally treating predetermined portions of said zone so as to degrade the electron paramagnetic resonance properties of said substance therein, thereby leaving a substance showing electron paramagnetic resonance properties only at non-treated portions of said zone.

10. A method according to claim 9, wherein said thermal treatment is performed by means of laser radiation.

11. A method according to claim 10, wherein the marks are visually masked.

12. A method according to claim 10, wherein the marks are paramagnetically masked by means of a material having an electron paramagnetic resonance peak having a peak width substantially greater than the peak width of said authenticating substance, and having a Lande factor (g) close to that of said authenticating substance.

* * * * *